United States Patent [19]

Mears

[11] Patent Number: 4,525,865
[45] Date of Patent: Jun. 25, 1985

[54] PROGRAMMABLE RADIO

[75] Inventor: David F. Mears, Lynchburg, Va.

[73] Assignee: General Electric Company, Lynchburg, Va.

[21] Appl. No.: 538,178

[22] Filed: Oct. 3, 1983

[51] Int. Cl.³ .............................................. H04B 1/16
[52] U.S. Cl. .................................... 455/186; 455/151
[58] Field of Search ....................... 455/151, 185, 186; 364/200 MS File, 900 MS File

[56] References Cited

U.S. PATENT DOCUMENTS

| | | | |
|---|---|---|---|
| 3,715,687 | 2/1973 | Solender | 331/179 |
| 3,894,247 | 7/1975 | De Jong | 307/208 |
| 3,968,440 | 7/1976 | Ehni, III . | |
| 4,020,467 | 4/1977 | Hashimoto et al. . | |
| 4,079,420 | 3/1978 | Mogi et al. | 358/195 |
| 4,093,921 | 6/1978 | Buss . | |
| 4,122,395 | 10/1978 | Schotz et al. . | |
| 4,173,737 | 11/1979 | Skerlos et al. . | |
| 4,194,159 | 3/1980 | Sasaki | 455/179 |
| 4,254,504 | 3/1981 | Lewis et al. | 455/76 |
| 4,291,413 | 9/1981 | Henderson et al. | 455/164 |
| 4,317,222 | 2/1982 | Bell et al. | 455/151 |
| 4,318,174 | 3/1982 | Suzuki et al. | 364/200 |
| 4,320,386 | 3/1982 | Harris | 340/825.22 |
| 4,322,855 | 3/1982 | Mogi et al. | 455/151 |
| 4,335,426 | 6/1982 | Maxwell et al. | 364/200 |
| 4,371,978 | 2/1983 | Lukso | 455/77 |
| 4,392,247 | 7/1983 | Van Deursen | 455/161 |
| 4,394,538 | 7/1983 | Warren et al. . | |

FOREIGN PATENT DOCUMENTS

| | | | |
|---|---|---|---|
| 2746532 | 4/1979 | Fed. Rep. of Germany | 455/151 |
| 2746552 | 4/1979 | Fed. Rep. of Germany | 455/186 |
| 53-825 | 4/1979 | Japan | 455/186 |

Primary Examiner—Jin F. Ng
Attorney, Agent, or Firm—M. Masnik; R. C. Lampe, Jr.

[57] ABSTRACT

An arrangement for externally programming a radio upon proper identification under microcomputer control using fixed and transient memories without removing or adding circuit modules to the radio.

9 Claims, 4 Drawing Figures

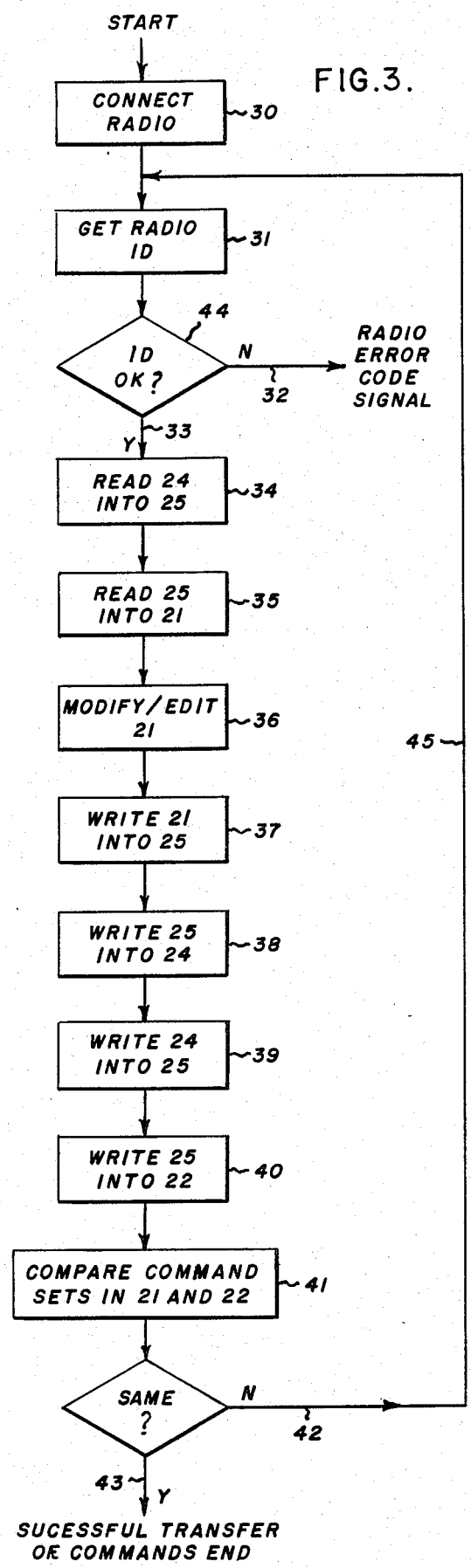
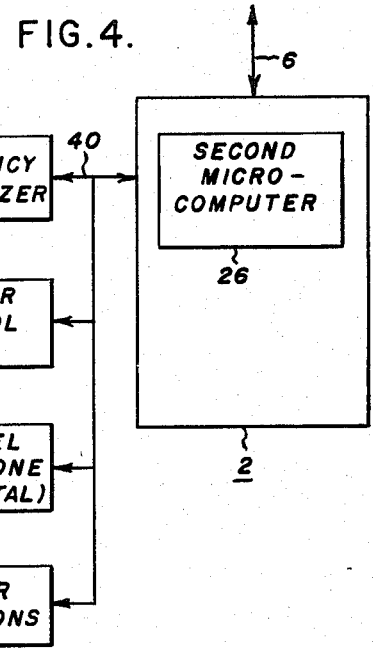

PROGRAMMABLE RADIO

BACKGROUND OF THE INVENTION

This invention relates to mobile radio communication systems and more particularly for loading and utilizing programmable information in mobile radio products.

It is oftentimes desirable in the mobile radio field to modify the mobile radio to accommodate desirable or changing environmental, operating, security, etc., needs. For example, it is desirable to be able to provide selectable frequency channels, to change or add addresses in either tone or digital format, to provide various controls such as carrier control timer, and any number of a wide variety of selectable options. For example, one desired option is the ability to select from one of several frequencies either for transmitting or receiving, or both, or to provide selectable addresses in either tone or digital format as the need arises, and to provide controls such as carrier control timer to limit the time allotted to any particular radio user to avoid monopolizing of the radio air time.

It is desirable that these operating characteristics or features be field programmable, that is implemented in the field at the user's choice with a minimum of loss of time with great reliability and with maximum flexibility. Systems in the past have not been fully field programmable in that the programming involved removing parts of the mobile radio to a central location where the desirable features were to be programmed and then returned to the radio with a consequent loss of time and an opportunity for error and damage. Such prior art systems have also been limited by their requirements for removing or adding modules from the radio to achieve the various option changes, the inclusion of considerable wiring and cabling which lends itself to pinching and breakage and involves considerable bulk and weight which inhibits maximum use of mobile radio equipment. This is particularly true in view of the trend to large scale integrated circuitry, where small, compact, lightweight portable characteristics are preferred.

Accordingly, it is an object of this invention to provide an improved programmable radio arrangement.

Another object of this invention is to provide a mobile radio which can be quickly and reliably programmed to provide a multitude of operational options.

It is another object of this invention to provide a programmable radio which can be reprogrammed countless times without opening the radio.

It is a further object of this invention to provide an improved programmable radio with a minimum of cabling and ties and weight requirements.

It is a further object of this invention to provide an improved mobile radio whose operating characteristics can be programmed without physical entry or removal of components to operate at user selectable frequencies with such options as tone or digital addresses, carrier control timer, etc.

Another object of this invention is to provide an improved arrangement for reliably comparing data representing commands stored in a radio non-volatile memory with a subset of the total available commands that can be changed available in an external programming source to verify that the radio non-volatile memory contains said subset of commands.

Another object is to program specified functions into a mobile radio in situ with a minimum of delay.

A further object is to provide an improved arrangement for programming a mobile radio with special function and comparing data for verification purposes as part of the programming function.

SUMMARY OF THE INVENTION

Briefly and in accordance with my invention, I provide a single, common programming source for programming a plurality of different radios with respectively different commands where the commands represent various operating characteristics. Each of the radios has a symbol stored in its memory identifying the radio as a particular type and a set of commands representing the radio's operating characteristics. Means are provided for reprogramming a desired one of said radios with a new set of commands comprising means for interrogating the given radio to read its stored symbol. Means are responsive to a read symbol representing only the desired type radio for causing the radio and the programming source to read the commands stored in said radio's memory and for modifying the read commands to correspond to the new set of commands. If the interrogation reveals the radio not to be the desired type radio, a signal indicating such is provided and undesired reprogramming is avoided. With respect to a proper interrogation, means are provided to store the modified commands in the radio's memory. In order to confirm the accuracy of the stored modified commands, means are provided to read the stored modified commands in the radio memory and to compare them with the new set of commands at said source. Finally, a signal is provided in response to the comparison results.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing in which:

FIG. 3 shows a flow chart for illustrating the operation of my control arrangement.

FIG. 4 illustrates in block diagram form the manner in which control signals are used to effect radio operating characteristic changes.

DESCRIPTION OF THE PREFERRED EMBODIMENT

Figure 1:
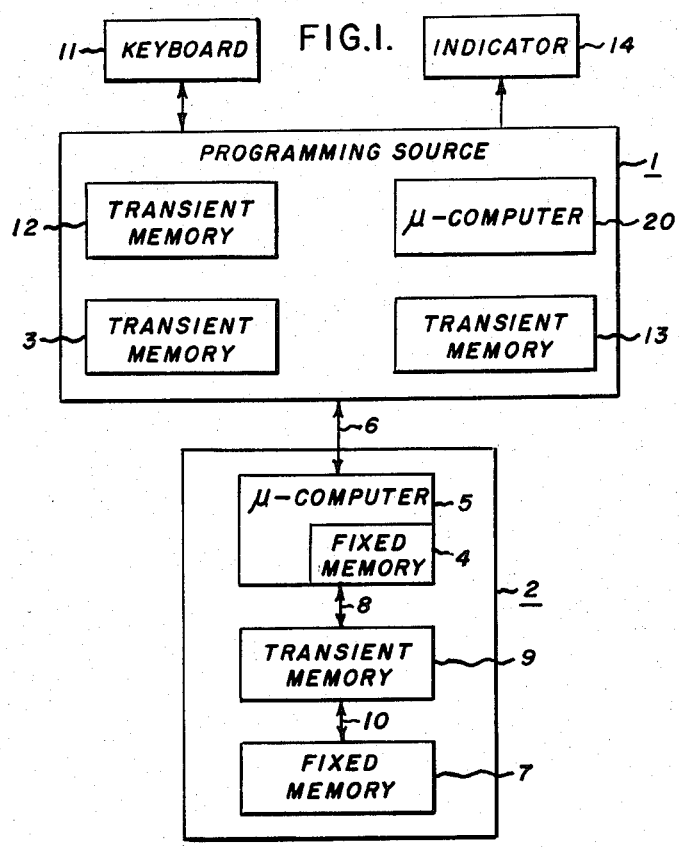
FIG. 1 illustrates in block diagram form a preferred arrangement in accordance with my invention.

While my control arrangement may have various applications, FIG. 1 illustrates in rough block diagram form a control arrangement for programming any one of a plurality of different radios with new commands from an external programming source without other than making an electrical connection with the radio, as for example via a cable. Referring to FIG. 1, there is provided an external programming source 1 for programming any one of a plurality of different radios such as radio 2 with new or substitute commands which may be inserted into the transient memory 12. Each of the radios has a symbol stored in its fixed memory 4 identifying the radio as a particular type radio. Radio types may differ in accordance with their model name, their power output, their frequency ranges and their general configuration. The different types of radios would vary in the sense that they would lend themselves to programming or not of certain options such as digital versus tone addresses, carrier control timer to monitor the amount of transmission time allotted to the radio to avoid monopolization of air time, the range of frequencies over which the radio is capable of operating, etc. If, for example, it is desired to reprogram a radio bearing the symbol, say radio A, the programming source has the desired or new commands representing these operating characteristics stored in its transient memory 12. This can be done in a well known manner either with an associated keyboard 11 or reading it in from a stored program source. In order to modify the radio with the changes desired for radio A, means 6 are provided for coupling the programming source 1 to the microcomputer 5 in the radio 2. Any existing commands controlling the operation of the radio are stored in fixed memory 7. To effect a change in the commands stored in this fixed memory and hence the operating characteristics of the radio 2, means 8 are provided for coupling the microcomputer 5 to the transient memory 9 and the transient memory 9 via coupling 10 to the fixed memory 7. The microcomputer 5 has stored in its fixed memory 4 a symbol establishing said radio as, for example, radio type A rather than a different radio type, say B. Operator initiated action, such as pressing a button, causes the programming source 1 to interrogate the radio 2 to read the symbol stored in memory 4. The programming source is responsive to a non-desired radio read symbol for providing an error signal on an indicator such as display 14 and avoiding reprogramming of the fixed memory 7. The programming source 1 is responsive to a desired radio read symbol representing, for example, radio type A for causing the programming source 1 and the radio 2 to read the selected operating function information or commands stored in fixed memory 7 and to write it into the transient memory 9 and to read the information written in the transient memory 9 and write it into the programming source memory 3. The information stored in the transient memory 3 is modified to correspond to the desired programming changes defined by the commands stored in memory 12 under control of microcomputer 20. Means are provided to read the modified function information stored in memory 3 and to write it via transient memory 9 into the fixed memory 7. Finally, to verify the accuracy of the changes made in commands stored in fixed memory 7, the system reads the modified information stored in fixed memory 7, writes it into the transient memory 13 via the transient memory 9. Means under control of microcomputer 20 are provided in the programming source 1 for comparing the modified stored information stored in the transient memory 13 with the desired information changes. Means responsive to a non-equal compare of the last named information causes an error signal to be produced at indicator 14. The operator then has to re-initiate the cycle for a programming change. On the other hand, the programming source 1 responds to an equal compare of the commands stored in the transient memories 3 and 13 to produce a signal on 14 indicating that a successful command change has taken place.

Figure 2:
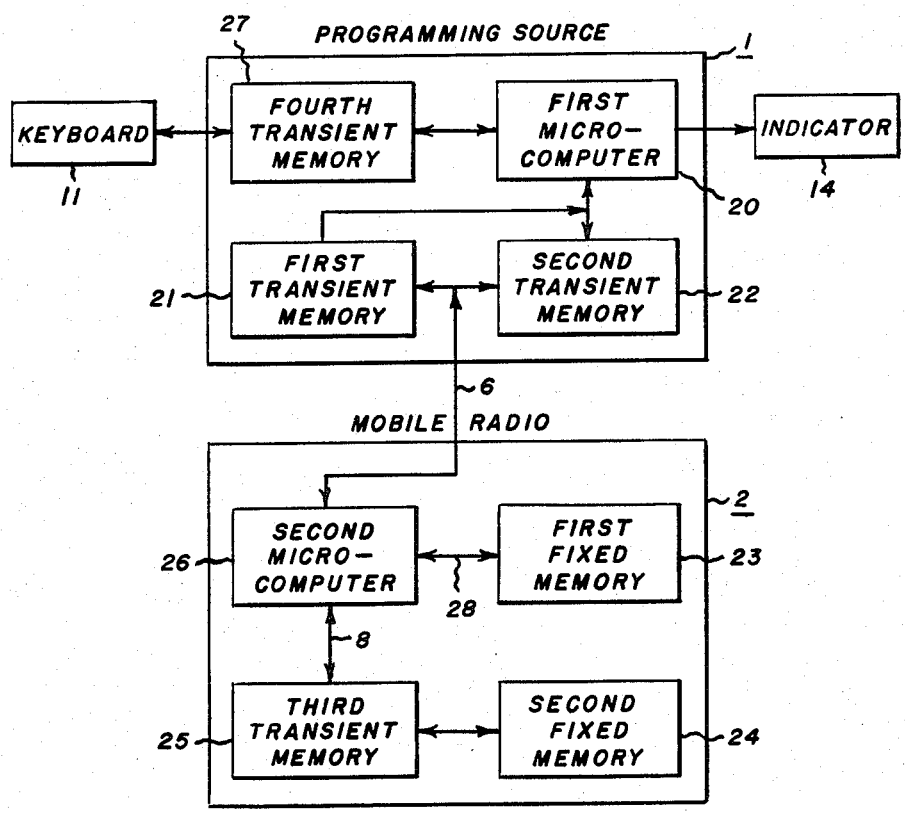
FIG. 2 illustrates in greater detail the components of the block diagram FIG. 1.

Referring to FIG. 2, there is shown in greater detail the elements of the arrangement of FIG. 1 for carrying out the present invention. The arrangement of FIG. 2 results in providing commands to a radio to exhibit certain characteristics such as preselected operating frequencies, address identification signals, carrier control timer, etc., under the control of a programmer 1 external of the radio 2. The programming source 1 comprises the first microcomputer 20 and a first and second transient memory 21 and 22 respectively. The mobile radio 2 comprises a first and second fixed memory 23 and 24, third transient memory 25 and a second microcomputer 26. Means 6 such as a two way cable connection couples the programming source or programmer to the second microcomputer 26. Means 8 couples the second microcomputer to the second fixed memory 24 via the third transient memory 25. Said second microcomputer 26 has identification symbols stored in its first fixed memory 23 over coupling 28. Means under the control of the operator causes the programming source to interrogate the second microcomputer 26 to establish the acceptability of the identification symbol stored in fixed memory 23. The programmer responds to non-acceptability to provide an error signal on 14 to avoid reprogramming of the commands stored in the fixed memory 24. The programming source 1, however, is responsive to the acceptability of the identification signal for providing first control signals on 6. The first and second microcomputers 20 and 26 are responsive to the first control signal passed over connection 6 to read the commands via connection 8 stored in said second fixed memory 24 into the first transient memory 21 via the third transient memory 25. The programming source 1 comprises a fourth transient memory 27. Means are provided to furnish desired commands into the fourth transient memory 27, as for example by a keyboard or external source of programming signals 11. The commands stored in the first transient memory 21 are modified under the control of the first microcomputer 20 to incorporate said desired commands stored in said fourth transient memory 27 to produce modified commands in the first transient memory 21. Essentially, the programming source 1 reprograms the radio memory to incorporate those commands which do not match the desired set of commands. The programming source accomplishes this by selecting from the read entire radio command set stored in memory 21 a subset representing the commands to be changed and then changes the selected subset to obtain the desired set of commands. Alternatively, the entire radio command set stored in memory 24 can be rewritten to incorporate the commands stored in memory 27 which include the subset to be changed. After the commands in memory 21 have been modified, they are stored in the second fixed memory 24 via the third transient memory 25 under the control of the first and second microcomputers 20 and 26. In order to verify that the commands last written into fixed memory 24 correspond with the changes desired as established by the programming source 1, means are provided in response to the microcomputers 20 and 26 to read the entire command set from the radio fixed or non-volatile memory 24 into the second transient or volatile memory 22 via the third transient memory 25. The commands stored in memory 21 and memory 22 are compared under the control of the programming source 20. The programming source responds to the results of the comparison to indicate on indicator 14 whether there is an equal compare or not. If the comparison is an equal compare, then the operator is assured that the radio has been reprogrammed in accordance with the instructions provided by the programming source 1.

The operations of the control arrangement of FIGS. 1 and 2 will now be described in connection with the flow chart of FIG. 3. In explaining the operation, we will assume that the operating characteristics for the radio, lets say radio type A, have been established by the program stored in the fixed memory 24. In one particular embodiment this memory 24 represents an EPROM as will be described later. It is also assumed that the programming source 1 has its fourth transient memory 27 programmed to include the identification of the symbol of the type radio to be programmed and either that the specific changes in certain of the commands stored in memory 24 need to be modified or that the entire command set stored in memory 24 is to be modified. The operation is started by connecting the radio 2 to the programming source 1 as shown by block or step 30. Operation for the program change is initiated by the pressing of a button or the closing of a switch as represented by block 31 to obtain the connected radio 2's identification or ID whereupon the microcomputer 20 causes the identification symbols stored in memory 23 to be read over line 6 under the control of microcomputers 20 and 26 and compared with the symbol stored in memory 27 as represented by the inquiry diamond 44 under control of microcomputer 20. If there is no equal comparison or no ID as shown by block 44, then a signal is produced on connection 32 indicating a selection error in the expected type radio. If the identification is correct, then a signal 33 indicates that the commands stored in fixed memory 24 are to be transferred as shown by blocks, 34 and 35 into the transient memory 21 via the transient memory 25 under the control of microcomputers 20 and 26. Thus, the commands stored in memory 24 are now also stored in memory 21. In one embodiment, programmer 1 selects only those specific commands stored in memory 21 which need to be modified to correspond with the commands stored in transient memory 27, and the program stored in transient memory 21 is thus modified under the control of microcomputer 20 as represented by block 36. After the program has been modified in memory 21, the microcomputers 20 and 26 operate to read the program from memory 21 into the transient memory 25 via connections 6 and 8 as shown by block 37. After the modified program has been read in word parallel over lead 8 into transient memory 25, it is transferred in parallel to the fixed memory 24 as represented by block 38. Memory 24 now contains, supposedly, the modified commands as established by the programming source 1. However, in order to automatically verify that in fact the proper commands have been entered, microcomputer 26 reads in parallel the modified program stored in fixed memory 24 into the transient memory 25 as represented by block 39 and then reads the command set from the transient memory 25 in word parallel into microcomputer 26 over coupling 8 and then by word bit serial over lead 6 into the transient memory 22 as represented by block 40. After all of the commands stored in memory 24 have been transferred into the transient memory 22, microcomputer 20 in programming source 1 causes a comparison to be made between the commands stored in the transient memories 21 and 22 as represented by block 41. If there is an equal compare, then the operator is given a signal over connection 43 indicating that the change has accurately taken place. However, if there is a non-equal compare, then the signal is generated on line 42 warning the operator that the changes have not taken place whereupon the operator can re-initiate a program change once again, starting at block 31 as shown by loop 45.

The memories employed in the one preferred embodiment of the invention were standard off-the-shelf items. For example, the fixed and volatile memories 24 and 25 were an $E^2$PROM sold as a Xicor 2212 NOVRAM. It actually comprises a 256×4 EPROM for the non-volatile portion 24 and a 256×4 RAM for the volatile portion 25. The microcomputer in the radio was an Intel 8049 whereas in the programmer it was a Rockwell 6502 microcomputer. The microcomputer comprises a non-volatile ROM and a volatile RAM. The programmer comprises three volatile memories, each of which is a Hitachi 6116 RAM. Referring to FIG. 4, after new commands have been stored in the fixed memory 24, the microcomputer 26 furnishes controls over leads 51 to, in sequence, change the frequency of a frequency synthesizer 50 in a well known manner, as for example by changing the voltage applied to a voltage controlled oscillator frequency and synthesizer divide ratios, to cause the carrier control timer to change in response to pulses and the address tone or digital unit to alter its addresses by a different combination of tones or digits and any other functions that may be required. The methods for altering such functions are well known in the art. For example, they are described in detail in the GE-MARC V Classic Trunked Mobile Radio Communication System Maintenance Manual published in 1982 wherein PROMs were associated with changing RF channel frequencies involving a frequency synthesizer, the tone addresses assigned a radio, etc.

It will thus be seen that I have provided a new and improved arrangement for programming a radio in situ with an external comment programming source other than an electrical connection. The programming commands which would control frequency, tone or digital addresses, timer, etc., can be changed as desired any time by coupling the radio to the programmer and effecting the changes required. While I have shown only one embodiment of my invention, persons skilled in the art will appreciate the modifications that may be made. Therefore, while my invention has been described with reference to a particular embodiment, it is to be understood that modifications may be made without departing from the spirit of the invention or from the scope of the claims.

What I claim as new and desire to secure by Letters Patent of the United States is:

1. Apparatus for programming a plurality of different radios with respectively different commands from a common programming source, each of said radios having a stored symbol identifying the radio and a memory storing commands representing its operating radio characteristics, said apparatus for programming a desired one of said different radios with a given set of commands comprising: means for interrogating said given radio to read its stored symbol, means responsive to a read symbol representing only said desired radio for reading the commands stored in said memory and for modifying said read commands to correspond to said given commands, means to store said modified commands in said radio memory, and means to confirm the accuracy of said stored modified commands including (a) means to read the stored modified commands and to compare them with said given commands at said source, and (b) means for providing a signal in response to said comparison.

2. Apparatus for programming a mobile radio with commands to exhibit certain characteristics such as a preselected operating frequency, address identification signals, and carrier control timer under the control of a programmer external of said radio, said apparatus comprising: a programmer including a first microcomputer, a first transient memory and a second transient memory, a mobile radio including a first fixed memory and a second fixed memory, a third transient memory and a second microcomputer, means for coupling said second microcomputer to said second fixed memory through said third transient memory, said second microcomputer having an identification symbol stored in first fixed memory, means for causing said programmer to interrogate said second microcomputer to establish the acceptability of the identification signals, said programmer being responsive to nonacceptability of said identification signal for providing an error signal, said programmer being responsive to the acceptability of said identification signal for providing a first control signal, said first and second microcomputer being responsive to said first control signal to read the commands stored in said second fixed memory into said first transient memory through third transient memory, said programmer also including a fourth transient memory, means for programming desired commands into said fourth transient memory, means for modifying the commands stored in said first transient memory under control of said first microcomputer to incorporate said desired commands stored in said fourth transient memory to produce modified commands in said first transient memory, means for reading said modified commands from said first transient memory to said second fixed memory via said third transient memory under control of the first and second microcomputers, means for reading the modified commands stored in said second fixed memory into said second transient memory via said third transient memory under control of said first and second microcomputers, means for comparing the modified commands stored in said first and second transient memories, means responsive to the result of said comparison to produce an output signal.

3. An apparatus according to claim 2 wherein commands are transferred between said first and second microcomputers in bit serial form.

4. An apparatus according to claim 2 further comprising means responsive to said output signal for causing said radio to exhibit said certain characteristics in response to commands stored in said second fixed memory under control of said second microcomputer.

5. Apparatus for selectively programming a plurality of mobile radios to exhibit respectively different combinations of operating functions under control of a common external programmer, said apparatus comprising: a programmer including a given first memory and a given second memory, said mobile radio including a fixed memory, a transient memory and a microcomputer, means for coupling said programmer to said microcomputer, means for coupling said microcomputer to said transient memory, means for coupling said transient memory to said fixed memory, means for storing a symbol in said radio to establish such radio as a given radio, means for causing said programmer to interrogate said radio to read said stored symbol, said programmer being responsive to a non-given radio read symbol for providing an error signal, said programmer being responsive to a given radio read symbol for causing the microcomputer to read selected operating function information stored in said fixed memory and to write it into said transient memory and to read the information written in said transient memory and write it into the programmer's given first memory under control of said programmer and said microcomputer, means for modifying the function information stored in said programmer given first memory under control of said programmer, means to read the modified function information stored in said programmer given first memory and to write it into said transient memory under control of said programmer and said microcomputer, means to read the modified function information stored in said transient memory and to write it into said fixed memory under control of said programmer and said microcomputer, means to read the modified information stored in said fixed memory and to write it into said transient memory under control of said microcomputer, means to read the information stored in said transient memory and to write said information in the programmer's given second memory under control of said programmer and said microcomputer, means for comparing the modified information stored in said programmer's first and second given memories, means responsive to a non-equal compare of said last named information to produce an error signal, and means responsive to an equal compare of said last named information to produce a successful operating function change signal.

6. An arrangement for programming radio commands into a non-volatile memory of a radio from a programming source of a desired set of commands external of said radio, said radio having a non-volatile memory programmed with data representing commands, said arrangement programming said radio memory only with respect to those commands which do not match the desired set of commands, said arrangement comprising: means for reading the entire command set from the radio memory to the programming source, said programming source including means for selecting from the entire read command set a subset representing the commands to be changed, means for changing said selected subset to obtain the desired set of commands, means to read said last named set of commands and to write it in said non-volatile memory under control of said programming source and a microcomputer included in said radio, means for verifying that said written last set of commands were correctly made including means for reading the entire command set from the radio non-volatile memory to the programming source, means for comparing the read last named entire radio command set with the desired set of commands in said programming source and for producing a signal in response to said comparing.

7. In combination, a programming source of an entire set of commands including a desired subset of commands, said source comprising a first microcomputer, a radio having a second microcomputer and a non-volatile memory programmed with data representing radio commands, means for reprogramming said radio memory only with respect to those commands which do not match the desired subset of commands, means for reading the entire command set from the radio memory to the programming source, means for selecting from the entire read command set a subset representing the commands to be changed, means for changing such selected subset to obtain the desired set of commands, means under control of said first and second microcomputers for storing said reprogrammed radio commands in said radio non-volatile memory, means responsive to said first and second microcomputers for verifying that the command changes were incorrectly reprogrammed comprising (a) means for reading the entire radio command set from said radio memory to the programming source, and (b) means for comparing the last named read entire radio command set with the entire set of source commands in said programming source to determine if they match, and for producing a signal indicative of whether or not there is a match.

8. Programmer apparatus for quickly and reliably changing the computer commands stored in the digital memory of a computerized mobile radio using only electrical signals and without requiring removal/replacement/insertion of physical radio components, said programmer apparatus comprising: coupling means for electrical connection with computer circuits while located in situ within said mobile radio; computer means including a manual control input keyboard, an output indicator means and at least one programming memory all coupled to a digital computer; said computer means being programmed to perform the following functions:

(a) to read first electrical signals from a computerized mobile radio coupled thereto via said coupling means, said first electrical signals representing identifying data indicative of the type of such coupled mobile radio;

(b) to compare said identifying data to predetermined identifying data and to indicate via said output indicator means that reprogramming of said coupled mobile radio in accordance with the following steps (c)–(f) should not proceed unless said coupled mobile radio is successfully identified by this compasrison;

(c) to read second electrical signals from said coupled mobile radio via said coupling means, said second electrical signals representing at least part of the computer commands at that time stored in the digital memory of the coupled mobile radio;

(d) to temporarily store in said programming memory digital data signals derived from the read electrical signals of (c) above;

(e) to selectively change at least some of said digital data signals to predetermined new command values; and (f) to transfer third electrical signals to said coupled mobile radio via said coupling means, said third electrical signals representing at least part of a new computer command to be stored in the digital memory of the coupled mobile radio.

9. Programmer apparatus as in claim 8 wherein said computer means is further programmed to follow function (f) with the following additional functions:

(g) to re-read said second electrical signals from said coupled mobile radio via said coupling means, said second electrical signals now representing said at least part of a new computer command;

(h) to temporarily store in said programming memory digital data signals derived from the read electrical signals of (g) above;

(i) to compare the stored data signals of (h) with said predetermined new command values; and (j) to indicate via said output indicator means a successful re-programming sequence in response to a successful comparison in (i) above.

* * * * *